US007449383B2

(12) United States Patent  
Yoon et al.

(10) Patent No.: US 7,449,383 B2  
(45) Date of Patent: Nov. 11, 2008

(54) METHOD OF MANUFACTURING A CAPACITOR AND METHOD OF MANUFACTURING A DYNAMIC RANDOM ACCESS MEMORY DEVICE USING THE SAME

(75) Inventors: Kwang-Sub Yoon, Yongin-si (KR); Jung-Hyeon Lee, Yongin-si (KR); Bong-Cheol Kim, Seoul (KR); Se-Young Park, Incheon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/898,667

(22) Filed: Sep. 14, 2007

(65) Prior Publication Data

US 2008/0070361 A1 Mar. 20, 2008

(30) Foreign Application Priority Data

Sep. 14, 2006 (KR) ...................... 10-2006-0089056

(51) Int. Cl.  
*H01L 21/8242* (2006.01)

(52) U.S. Cl. ...................... 438/254; 438/256; 438/397; 438/399

(58) Field of Classification Search .................. 438/239, 438/253–254, 256, 396–397, 399, 781–783  
See application file for complete search history.

(56) References Cited

U.S. PATENT DOCUMENTS 5,686,337 A * 11/1997 Koh et al. .................... 438/240
5,753,547 A * 5/1998 Ying .......................... 438/253
5,817,555 A * 10/1998 Cho ........................... 438/253
6,069,038 A * 5/2000 Hashimoto et al. .......... 438/241
6,248,625 B1 * 6/2001 Hirota et al. ................ 438/253
6,255,151 B1 * 7/2001 Fukuda et al. .............. 438/197
6,258,662 B1 * 7/2001 Wang et al. ................. 438/253

FOREIGN PATENT DOCUMENTS

| JP | 08-125021 | * | 5/1996 |
| JP | 11-008233 | * | 1/1999 |
| JP | 2001-053251 | | 2/2001 |
| KR | 1020010003253 | | 1/2001 |
| KR | 10-2003-0049843 | | 6/2003 |
| KR | 1020030057640 | | 7/2003 |
| KR | 1020040001886 | | 1/2004 |
| KR | 1020040046704 | | 6/2004 |
| KR | 10-0505675 | | 7/2005 |

* cited by examiner

*Primary Examiner*—M. Wilczewski  
*Assistant Examiner*—Toniae M. Thomas  
(74) *Attorney, Agent, or Firm*—Harness, Dickey & Pierce P.L.C.

(57) ABSTRACT

In a method of manufacturing a capacitor and a method of manufacturing a dynamic random access memory device, an insulating layer covering an upper portion of a conductive layer may be provided with an ozone gas so as to change the property of the upper portion of the insulating layer. The upper portion of the insulating layer may be chemically removed to expose the upper portion of the conductive layer. The exposed upper portion of the conductive layer may be removed so as to transform the conductive layer into a lower electrode. The remaining portion of the insulating layer may be removed, and an upper electrode may be formed on the lower electrode.

20 Claims, 11 Drawing Sheets

METHOD OF MANUFACTURING A CAPACITOR AND METHOD OF MANUFACTURING A DYNAMIC RANDOM ACCESS MEMORY DEVICE USING THE SAME

PRIORITY STATEMENT

This application claims priority under 35 U.S.C. §119 to Korean Patent Application No. 10-2006-0089056, filed on Sep. 14, 2006 in the Korean Intellectual Property Office (KIPO), the entire contents of which are incorporated herein by reference.

BACKGROUND

1. Technical Field

Example embodiments relate to a method of manufacturing a capacitor and a method of manufacturing a semiconductor device using the method of manufacturing the capacitor. Example embodiments also relate to a method of manufacturing a capacitor including a lower electrode made of metal and a method of manufacturing a dynamic random access memory device including the capacitor.

2. Description of the Related Art

Semiconductor devices have been widely developed as information devices, e.g., computers. Consequently, semiconductor devices may be required to have a higher operational speeds and larger storage capacities. To meet the above requirements, manufacturing techniques have been developed to improve integration degree, reliability, and response speed.

A capacitor may be employed in a logic device and a memory device (e.g., a dynamic random access memory (DRAM) device) to store data. The capacitor may be formed such that the capacitor has a relatively invariable energy density and relatively stable characteristics independent of voltage. A polysilicon-insulator-polysilicon (PIP) capacitor has been widely used. When a lower electrode of the capacitor is formed using polysilicon, the lower electrode may have a three dimensional shape and may be relatively complex, because polysilicon may be relatively stable at higher temperatures and may have improved step coverage characteristics.

However, a capacitance of the PIP capacitor may be undesirably varied in accordance with a voltage applied to the PIP capacitor. For example, depletion layers may be formed at interfaces between an upper electrode and a dielectric layer and between the upper electrode and an insulating layer when the voltage is applied to the PIP capacitor. Formation of depletion layers may result from the lower electrode and the upper electrode of the PIP capacitor being formed of doped polysilicon. When the depletion layer is formed, a dielectric constant affecting a capacitance of the PIP capacitor may vary as the thickness of the dielectric layer increases. Thus, the capacitance of the PIP capacitor may not be stable. Furthermore, it may be more difficult to obtain a desired capacitance when the PIP capacitor is employed in a higher integrated semiconductor device having a design rule lower than about 90 nm.

To overcome the problem described above, a metal-insulator-metal (MIM) capacitor, including an electrode made of metal, has been developed. In addition, a capacitor including a lower electrode having a cylindrical shape has been developed. To form the cylindrically-shaped lower electrode of the capacitor, a chemical mechanical polishing (CMP) process may be employed for a node separation. However, When a CMP process is employed for the node separation, additional processes for forming a sacrificial layer used as a buffer layer may be required. Consequently, increased efforts and costs may be required to perform the CMP process. Furthermore, where the lower electrode of the capacitor includes a metal, the removal rate of the lower electrode in the CMP process may be lower than where the lower electrode includes polysilicon. Thus, more time may be required to polish a lower electrode including a metal.

As a result, methods have been developed to achieve node separation of the lower electrode without performing the CMP process. Such methods may involve forming a photoresist pattern in an opening used for forming the capacitor. An etching process may be performed for the node separation. However, the above methods may be directed to a concave-shaped lower electrode rather than a cylindrically-shaped lower electrode. A concave-shaped lower electrode may be structurally stable, but the area on which a dielectric layer may be formed may be smaller than the area of a cylindrically-shaped lower electrode. For example, the effective area of a concave-shaped lower electrode may be limited to its inner wall. In addition, the concaved-shaped lower electrodes used in the above methods may include polysilicon instead of metal. As described above, when the lower electrode includes polysilicon, a depletion layer may be formed at an interface between the lower electrode and the dielectric layer. Thus, a dielectric constant affecting the capacitance of the capacitor including the concave-shaped lower electrode may vary as the thickness of the dielectric layer increases such that it may be difficult to obtain the necessary capacitance for a higher integrated semiconductor device.

SUMMARY

Example embodiments provide a method of manufacturing a capacitor capable of achieving a more stable node separation and a relatively large capacitance. Example embodiments also provide a method of manufacturing a dynamic random access memory device having the above capacitor.

A method of manufacturing a capacitor may include forming a mold layer having an opening exposing a contact plug formed on a substrate. A conductive layer having a substantially uniform thickness may be formed on a sidewall of the opening and on an upper face of the mold layer. A spin-on layer may be formed on the conductive layer to fill up the opening. An upper portion of the spin-on layer may be provided with an ozone gas to transform the spin-on layer into an insulating layer, wherein the insulating layer may include an upper insulating film having a lower face that may be lower than the upper face of the mold layer and a lower insulating film below the upper insulating film. The upper insulating film may be selectively removed to expose a top portion of the conductive layer. A cylindrical lower electrode may be formed by removing the exposed top portion of the conductive layer. The mold layer and the lower insulating film may be removed. A dielectric layer may be formed on the substrate and on an outer sidewall, an inner sidewall, and a bottom face of the cylindrical lower electrode. An upper electrode may be formed on the dielectric layer. Accordingly, a capacitor may be manufactured.

A method of manufacturing a dynamic random access memory device may include forming a transistor on a substrate. A first insulating interlayer having first and second contact p)ads connected to a source/drain region of the transistor may be formed. A second insulating interlayer having a bit line connected to the first contact pad may be formed. A third insulating interlayer having a capacitor contact plug connected to the second contact pad may be formed. A capacitor manufactured according to the above method may be formed on the transistor.

For example, a mold layer having an opening exposing a surface of the capacitor contact plug may be formed on the third insulating layer. A conductive layer (that may be transformed into a cylindrical lower electrode) may be formed on a sidewall of the opening and on an upper face of the mold layer. A spin-on layer may be formed on the conductive layer to fill up the opening. An upper portion of the spin-on layer may be provided with an ozone gas to transform the spin-on layer into an insulating layer, wherein the insulating layer may include an upper insulating film having a lower face that may be lower than the upper face of the mold layer and a lower insulating film below the upper insulating film. The upper insulating film may be selectively removed to expose a top portion of the conductive layer. A cylindrical lower electrode may be formed by removing the exposed top portion of the conductive layer. The mold layer and the lower insulating film may be removed. A dielectric layer may be formed on the substrate and on an outer sidewall, an inner sidewall, and a bottom face of the cylindrical lower electrode. An upper electrode may be formed on the dielectric layer. Thus, a dynamic random access memory device may be manufactured.

According to example embodiments, a chemical mechanical polishing (CMP) process may not be performed during a node separation for forming a lower electrode of a capacitor. Thus, the time and cost for the node separation may be reduced. In addition, an upper portion of an insulating layer covering a conductive layer (that may be transformed into a lower electrode) may be chemically removed to expose a top portion of the conductive layer. Thus, damage to the conductive layer may be reduced. Consequently, defects to a semiconductor device may decrease and reliability may increase.

BRIEF DESCRIPTION OF THE DRAWINGS

The above and other advantages of example embodiments may become more apparent with reference to the following detailed description in conjunction with the accompanying drawings.

DETAILED DESCRIPTION OF EXAMPLE EMBODIMENTS

Figure 1:
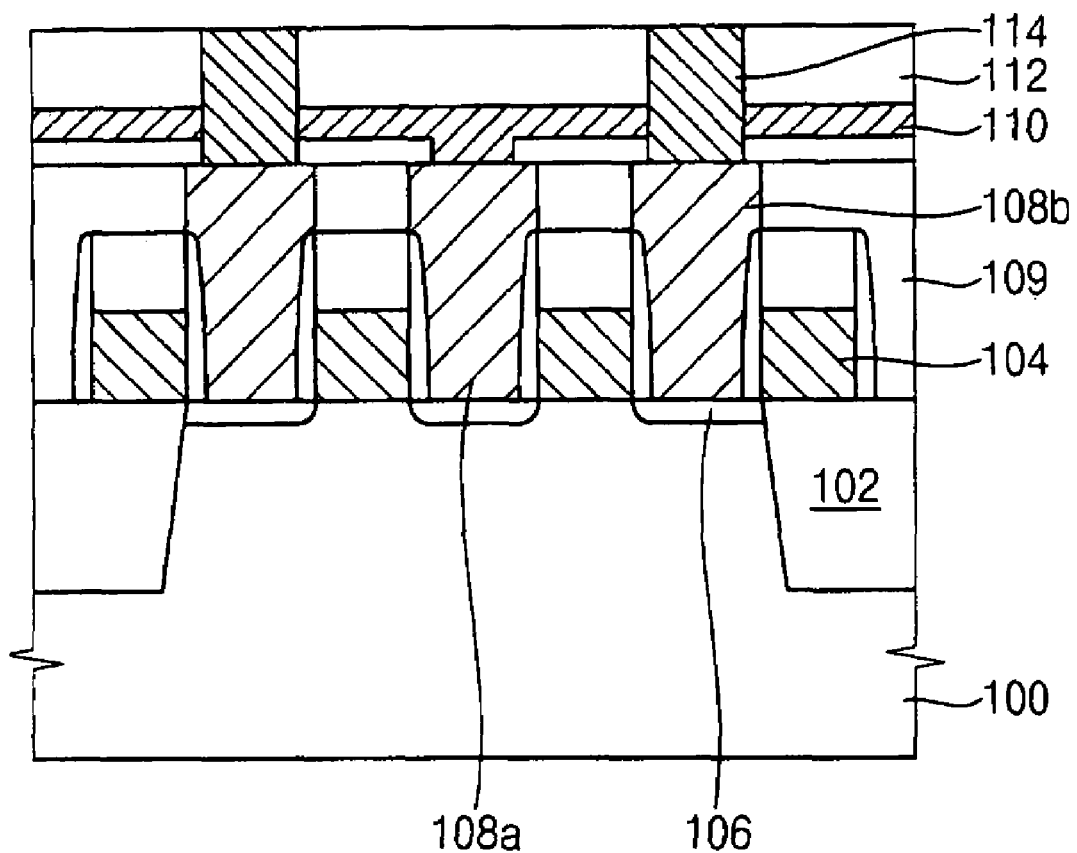
FIGS. 1 to 11 are cross-sectional views illustrating a method of manufacturing a dynamic random access memory (DRAM) device according to example embodiments of the present invention.

Example embodiments may be described with reference to the accompanying drawings. Example embodiments may, however, be embodied in many different forms and should not be construed as limited to the embodiments set forth herein. The principles and features herein may be employed in varied and numerous embodiments without departing from the scope of example embodiments. In the drawings, the size and thickness of layers and regions may have been exaggerated for clarity. The drawings may also not be to scale. Like reference numerals designate like elements throughout the drawings.

It will also be understood that when an element or layer is referred to as being "on," "connected to," and/or "coupled to" another element or layer, the element or layer may be directly on, connected, and/or coupled to the other element or layer or intervening elements or layers may be present. In contrast, when an element is referred to as being "directly on," "directly connected to," and/or "directly coupled to" another element or layer, no intervening elements or layers may be present. As used herein, the term "and/or" may include any and all combinations of one or more of the associated listed items.

It will also be understood that although the terms first, second, etc. may be used herein to describe various elements, components, regions, layers, and/or sections, the elements, components, regions, layers, and/or sections should not be limited by these terms. These terms may be used to distinguish one element, component, region, layer, and/or section from another element, component, region, layer, and/or section. For example, a first element, component, region, layer, and/or section discussed below may be termed a second element, component, region, layer, and/or section without departing from the present teachings.

Spatially relative terms, e.g., "beneath," "below," "lower," "above," "upper," and the like may be used to describe an element and/or feature's relationship to another element(s) and/or feature(s) as, for example, illustrated in the figures. It should be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (e.g., rotated 90 degrees or at other orientations) and the spatially relative descriptors used herein interpreted accordingly.

The terminology used herein is for the purpose of describing example embodiments only and is not intended to limit the present disclosure. As used herein, the singular terms "a," "an," and "the" are intended to include the plural forms as well, unless the context clearly indicates otherwise. It should be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof.

Example embodiments are described herein with reference to cross-sectional illustrations that may be schematic illustrations of idealized embodiments (and intermediate structures) of example embodiments. As such, variations of the shapes depicted in the illustrations as a result of, for example, manufacturing techniques and/or tolerances are to be expected. Thus, example embodiments should not be construed as limited to the shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein may have the same meaning as what is commonly understood by one of ordinary skill in the art. It should be further understood that terms, such as those defined in commonly used dictionaries, should be interpreted as having a meaning that is consistent with their meaning in the context of this specification and the relevant art and will riot be interpreted in an idealized and/or overly formal sense unless expressly so defined herein.

FIGS. 1 to 11 are cross-sectional views illustrating a method of manufacturing a dynamic random access memory (DRAM) device according to example embodiments of the present invention. Referring to FIG. 1, a shallow trench isolation process may be performed on a semiconductor substrate 100 to form an isolation layer 102. A transistor including a source/drain 106 and a gate 104 may be formed on the portion of the substrate 100 having the isolation layer 102. A first insulating interlayer 109 may be formed to cover the transistor.

The first insulating interlayer 109 may be partially etched to form contact holes exposing the source/drain 106. First and second pad electrodes (e.g., contact pads) 108a and 108b electrically connected to the source/drain 106 may be formed in the contact holes. The first and second pad electrodes 108a and 108b may be electrically connected to a bit line 110 and a capacitor, respectively. The bit line 110 connected to the first pad electrode 108a may be formed on the first insulating interlayer 109. A second insulating interlayer 112 may be formed to cover the bit line 110.

The second insulating interlayer 112 may be partially etched so that a contact hole exposing the second pad electrode 108b may be formed. Although not illustrated in the drawings, an upper portion of the contact hole may be wider than a lower portion of the contact hole. The contact hole may be filled with a conductive material and a planarization process may be performed. Thus, a contact plug 114 (that may be connected to a lower electrode 122a (FIG. 9) of the capacitor) may be formed. The contact plug 114 may include polysilicon.

When the upper portion of the contact hole is wider than the lower portion of the contact hole, an upper portion of the contact plug 114 may be wider than a lower portion of the contact plug 114. Thus, a connection area between the contact plug 114 and the lower electrode 122a (FIG. 9) of the capacitor may be increased. Accordingly, an alignment margin of the lower electrode 122a (FIG. 9) of the capacitor may increase.

Figure 2:
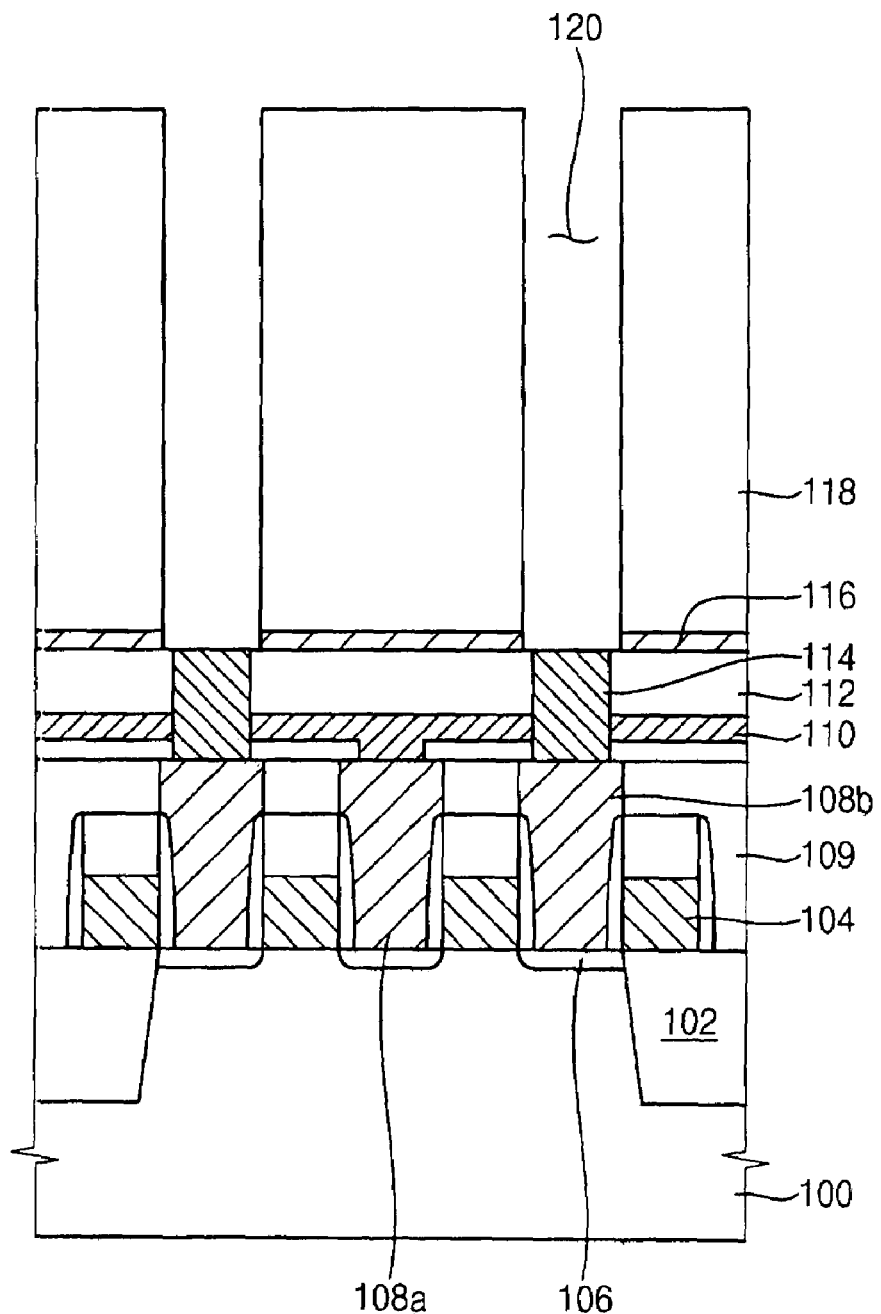

Referring to FIG. 2, an etch stop layer 116 may be formed on the second insulating interlayer 112 and the contact plug 114. The etch stop layer 116 may be formed using a material having an etching selectivity with respect to a mold layer 118 such that the etch stop layer 116 may still remain after etching the mold layer 118. For example, the etch stop layer 116 may be a silicon nitride layer.

The mold layer 118 may be formed on the etch stop layer 116. The mold layer 118 may be formed using a silicon oxide. For example, the mold layer 118 may be formed using TEOS, HDP-CVD oxide, PSG, USG, BPSG, or SOG. The mold layer 118 may also be formed by stacking at least two films formed from different silicon oxides. When the mold layer 118 is formed by stacking at least two films formed from silicon oxides having different etch rates, the lower electrode 122a (FIG. 9) of the capacitor may have a stepped sidewall. The thickness of the mold layer 118 may be varied in accordance with the desired capacitance of the capacitor. For example, the thickness of the mold layer 118 may be adjusted to obtain the desired capacitance of the capacitor, because the height of the capacitor may be determined by the thickness of the mold layer 118.

The mold layer 118 and the etch stop layer 116 may be partially etched so that an opening 120 exposing the contact plug 114 may be formed. An upper face of the contact plug 114 may be exposed from a bottom face of the opening 120.

When the opening, 120 is formed, an exposed portion of the etch stop layer 116 may be removed. Thus, although not illustrated in the drawings, the upper portion of the contact plug 114 may be slightly removed when the opening 120 is formed.

Figure 3:
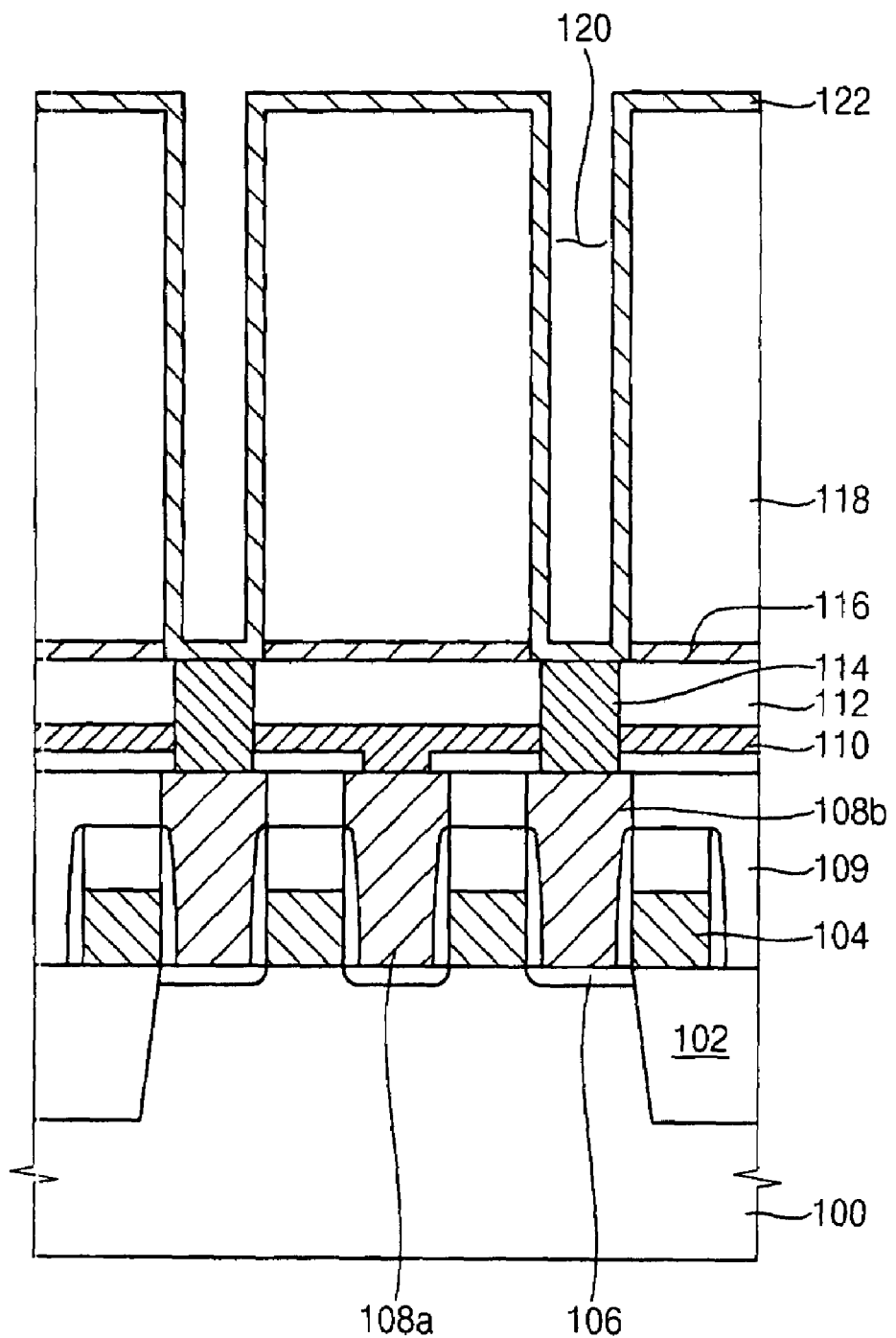
Figure 11:
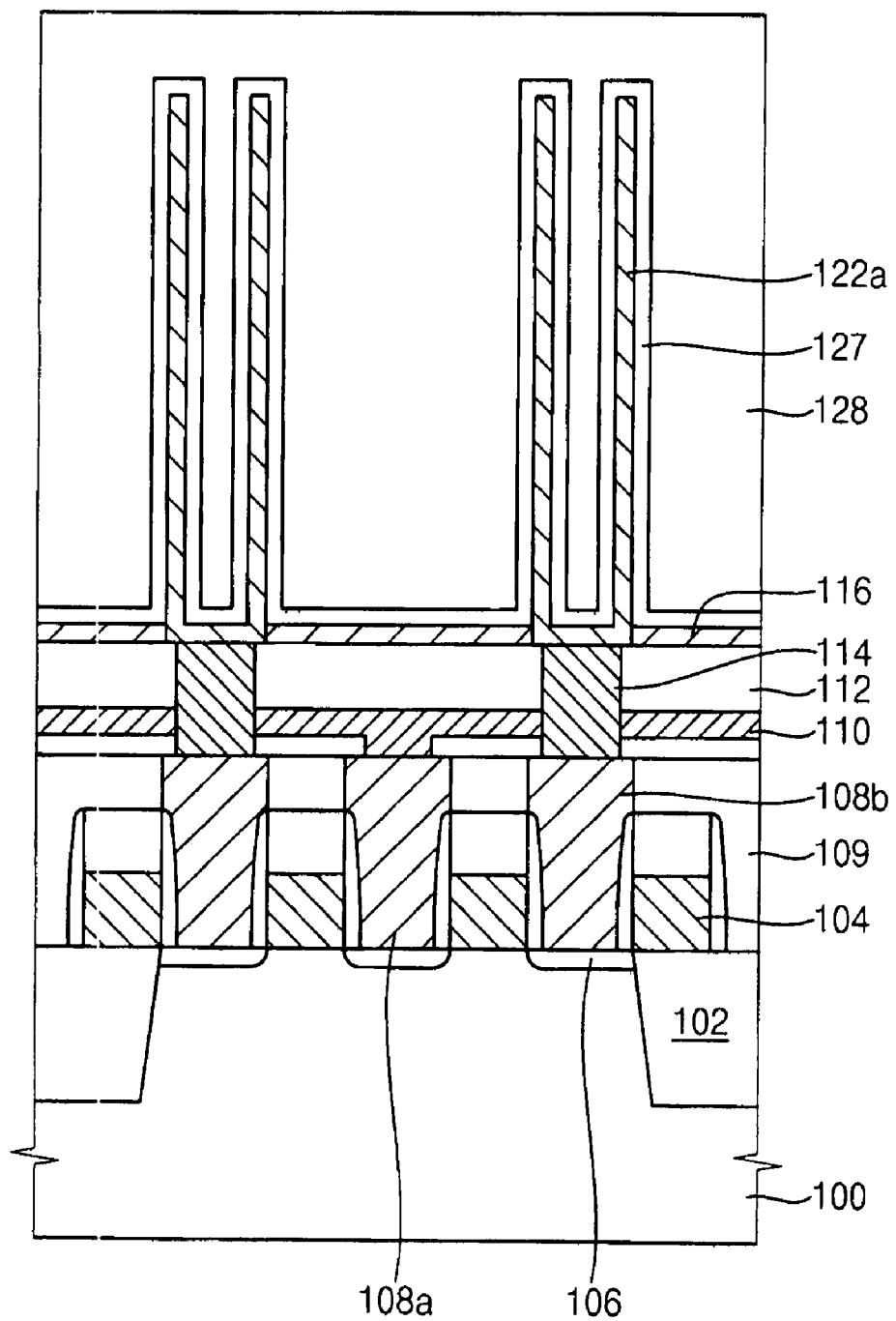

Referring to FIG. 3, a conductive layer 122 (that will be transformed into the lower electrode 122a (FIG. 9) of the capacitor) may be formed on an inner face (e.g., sidewall) of the opening 120 and on an upper face of the mold layer 118. The conductive layer 122 may be formed using a different material from the contact plug 114. The conductive layer 122 may be formed of a metal or a material having a metal. The conductive layer 122 may include titanium and/or titanium nitride. For example, the conductive layer 122 may include a titanium film and a titanium nitride film stacked on each other. In such a case, the titanium film may be used as a barrier film to reduce or prevent the diffusion of metal atoms in the conductive layer 122. As described above, the conductive layer 122 may be formed of a metal or a material including a metal, instead of polysilicon. Thus, a depletion layer may not be formed at the interface between the lower electrode 122a and a dielectric layer 127 (FIG. 11). Accordingly, the capacitance of the capacitor may be increased.

The conductive layer 122 may be formed using a deposition process having improved step coverage characteristics. Consequently, the conductive layer 122 may be formed along the inner face (e.g., sidewall) of the opening 120 having a higher aspect ratio. In addition, the conductive layer 122 may be relatively thin so as to not fill up the opening 120. Accordingly, the conductive layer 122 may be formed using a chemical vapor deposition (CVD) process, a cyclic chemical vapor deposition (cyclic-CVD) process, or an atomic layer deposition (ALD) process. For example, the conductive layer 122 may be formed of a metal or a material including a metal. The conductive layer 122 may also be formed of a polysilicon doped with impurities. Additionally, the conductive layer 122 may include a titanium film and a titanium nitride film.

Figure 4:
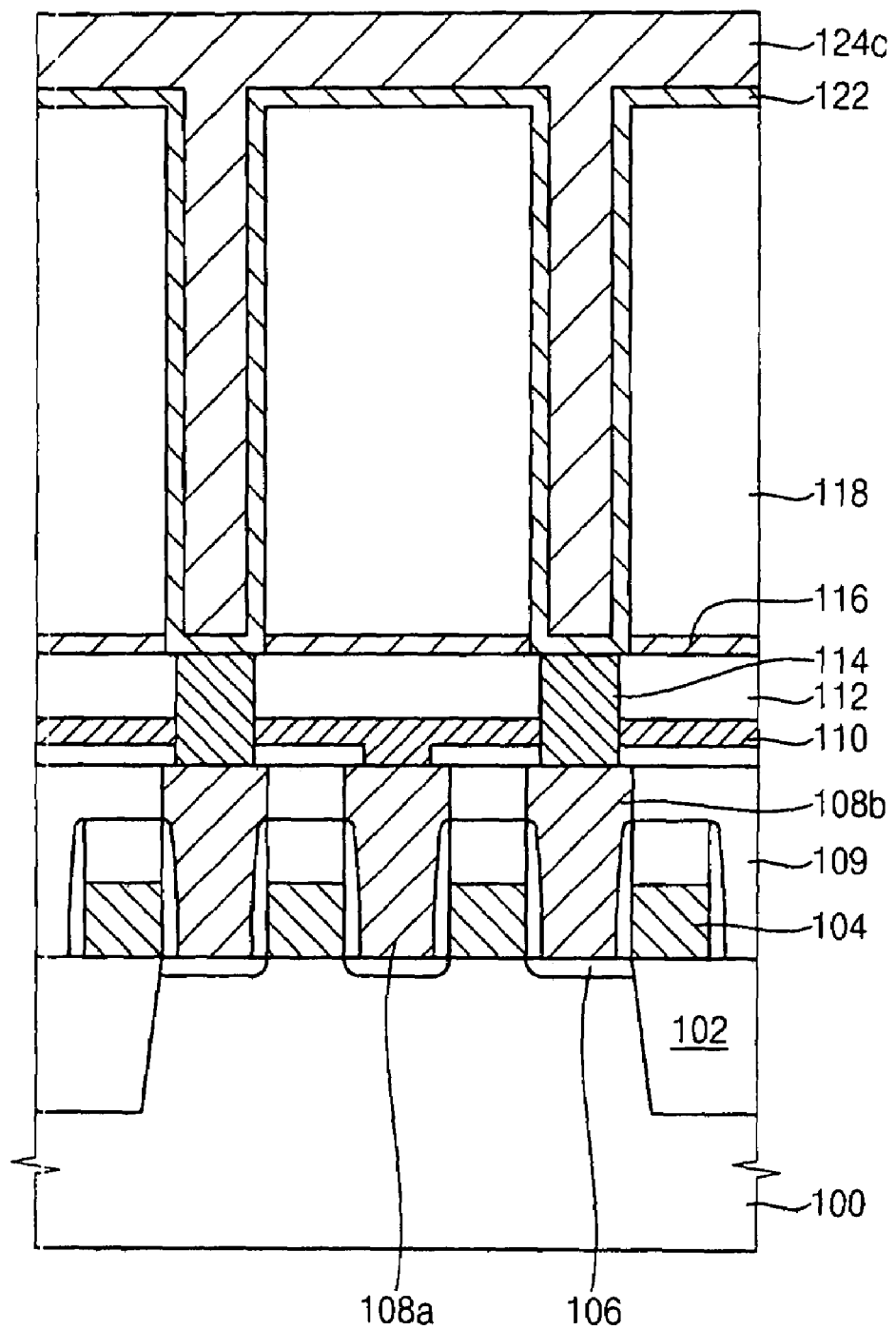

Referring to FIG. 4, a preliminary spin-on layer 124c, including a dielectric material and a solvent, may be formed on the conductive layer 122. The dielectric material may include silicon. For example, the dielectric material may be hydrogen silsesquioxane (HSQ), methyl silsesquioxane (MSQ), methyl hydrogen silsesquioxane (MHSQ), flowable oxide (FOX), or tonen silazene (TOSZ). These materials may be used alone or in a mixture thereof. Hydrogen silsesquioxane may include silicon combined with hydrogen (H). Methyl silsesquioxane may include silicon combined with a methyl group (—CH3). Methyl hydrogen silsesquioxane may include silicon combined with hydrogen and silicon combined with a methyl group. The solvent may be propylene glycol dimethyl ether (PGDE). Because the preliminary spin-on layer 124c may include the solvent, the preliminary spin-on layer 124c may have fluidity.

Figure 5:
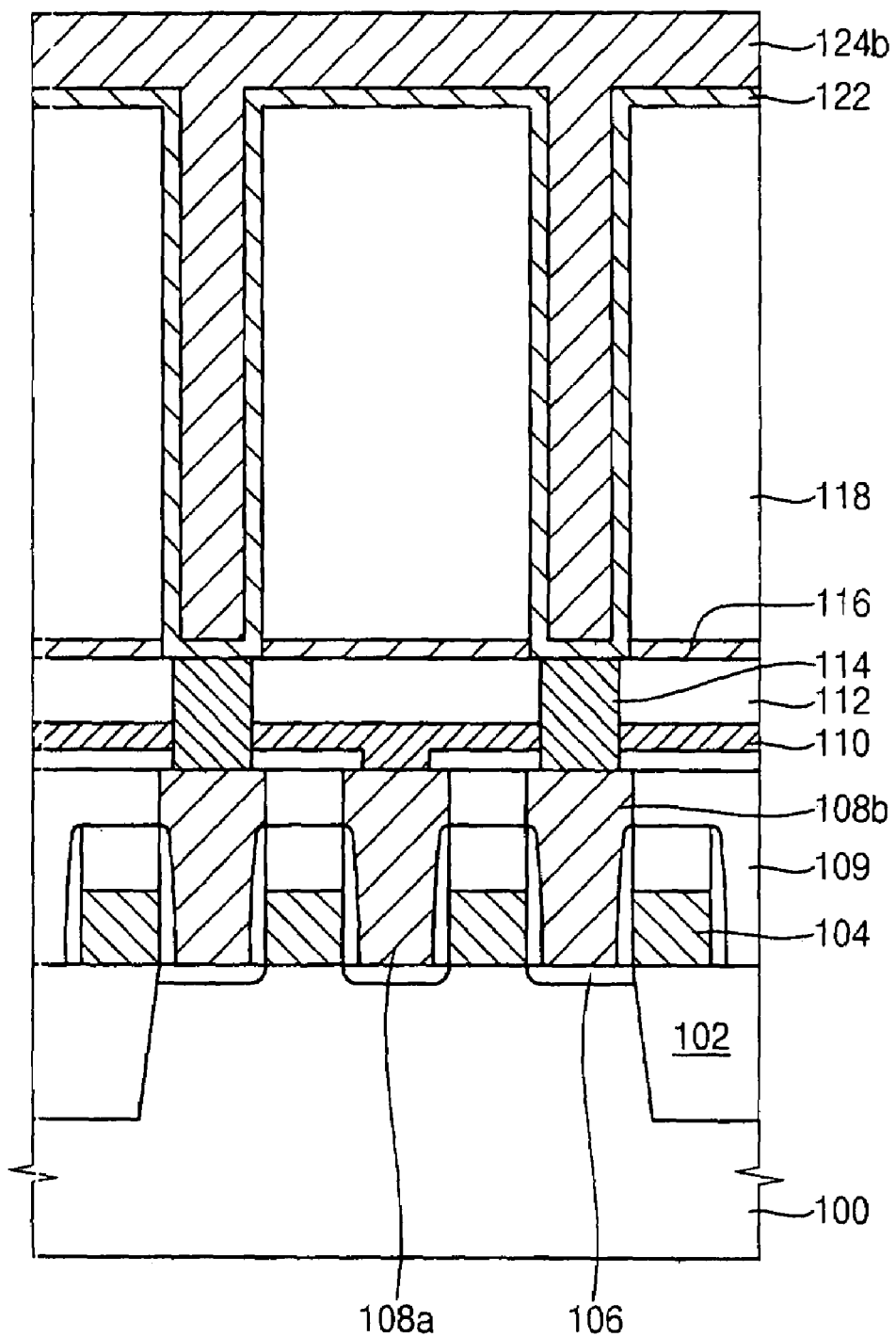

Referring to FIG. 5, a preliminary thermal treatment may be performed on the preliminary spin-on layer 124c to form a spin-on layer 124b. The preliminary thermal treatment may include a preliminary first thermal treatment, a preliminary second thermal treatment, and a preliminary third thermal treatment. The preliminary first thermal treatment may be performed at a temperature of about 70° C. to about 90° C. for about 1 to about 3 minutes in a nitrogen ($N_2$) atmosphere. For example, the preliminary first thermal treatment may be performed at a temperature of about 80° C. for about 2 minutes in the nitrogen atmosphere. The solvent in the preliminary spin-on layer 124c may be removed by the preliminary first thermal treatment so that the spin-on layer 124b may have increased solidity.

The preliminary second thermal treatment may be performed at a temperature of about 90° C. to about 260° C. for about 1 minute to about 3 minutes in a nitrogen atmosphere. For example, the preliminary second thermal treatment may be performed at a temperature of about 150° C. for about 2 minutes in a nitrogen atmosphere. The surface uniformity (e.g., flatness) of the spin-on layer 124b may be improved by the preliminary second thermal treatment.

The third thermal treatment may be performed at a temperature of about 260° C. to about 370° C. for about 1 minute to about 3 minutes in a nitrogen atmosphere. For example, the preliminary third treatment may be performed at a temperature of about 350° C. for about 2 minutes in a nitrogen atmosphere. The spin-on layer 124b may become denser as a result of the preliminary third thermal treatment.

Figure 6:
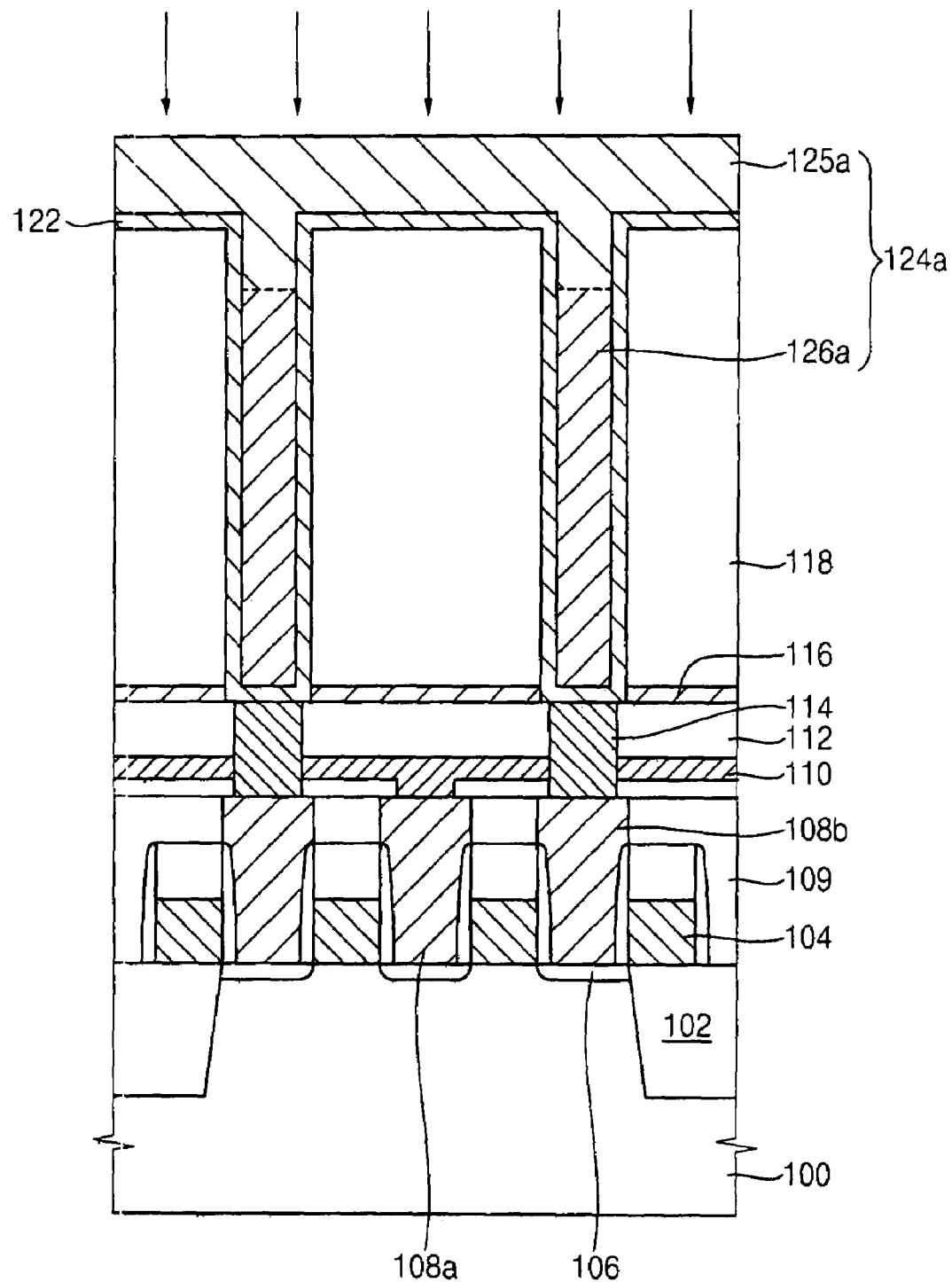

Referring to FIG. 6, an upper portion of the spin-on layer 124b may be provided with an ozone ($O_3$) gas to form a preliminary insulating layer 124a, which may include a preliminary upper insulating film 125a and a preliminary lower insulating film 126a. A lower face of the preliminary upper insulating film 125a may be lower than an upper face of the mold layer 118.

When the spin-on layer 124b is provided with the ozone gas, hydroxyl groups (—OH) may substitute for hydrogen and/or methyl groups combined with silicon in the low-k material to generate byproducts. Hydroxyl groups combined with respective silicon atoms may generate silicon oxide ($SiO_2$) and moisture ($H_2O$) in a process of dehydration/condensation reactions. Thus, the preliminary upper insulating film 125a may include the byproducts, e.g., silicon oxide and moisture. When the thickness of the preliminary upper insulating film 125a is increased, the amount of byproducts (e.g., silicon oxide and moisture) in the preliminary upper insulating film 125a may also increase. The preliminary lower insulating film 126a may include a dielectric material.

When the ozone density of the ozone gas is lower than about 100 $g/Nm^3$, the hydroxyl group may not efficiently substitute for hydrogen and/or methyl groups combined with silicon in the dielectric material. When the ozone density of the ozone gas is higher than about 350 $g/Nm^3$, the preliminary upper insulating film 125a may become relatively thick. In addition, the preliminary upper insulating film 125a may include larger amounts of byproducts and moisture. Consequently, the byproducts and moisture may not be sufficiently removed despite the performance of a main thermal treatment on the preliminary insulating layer 124a. Thus, the ozone density of the ozone gas may be in the range of about 100 $g/Nm^3$ to about 350 $g/Nm^3$.

When the preliminary insulating layer 124a is formed at a temperature lower than about 50° C., the ozone gas may have a smaller amount of energy. Consequently, the hydroxyl group may not be able to efficiently substitute for hydrogen and/or methyl groups combined with silicon in the dielectric material. When the preliminary insulating layer 124a is formed at a temperature above 450° C., the preliminary upper insulating film 125a may become relatively thick. In addition, the preliminary upper insulating film 125a may include a larger amount of byproducts and moisture. Accordingly, the byproducts and moisture may not be sufficiently removed despite the performance of a main thermal treatment on the preliminary insulating layer 124a. Thus, the preliminary insulating layer 124a may be formed at a temperature in the range of about 50° C. to about 450° C.

When the time for forming the preliminary insulating layer 124a is less than about 5 seconds, hydroxyl groups may not efficiently substitute for hydrogen and/or methyl groups combined with silicon in the dielectric material. When the time for forming the preliminary insulating layer 124a is longer than about 600 seconds, the preliminary upper insulating film 125a may be relatively thick. In addition, the preliminary upper insulating film 125a may include larger amounts of byproducts and moisture. Thus, the byproducts and moisture may not be sufficiently removed despite the performance of a main thermal treatment on the preliminary insulating layer 124a. Thus, the preliminary insulating layer 124a may be formed for a duration of about 5 seconds to about 600 seconds.

The preliminary upper insulating film 125a and the preliminary lower insulating film 126a may include a silicon oxide and a dielectric material, respectively. Thus, the dielectric constant of the preliminary lower insulating film 126a may be smaller than that of the upper insulating film 125a. In addition, the preliminary upper insulating film 125a may be formed by a dehydration/condensation reaction. Thus, the preliminary upper insulating film 125a may be denser than the preliminary lower insulating film 126a.

Figure 7:
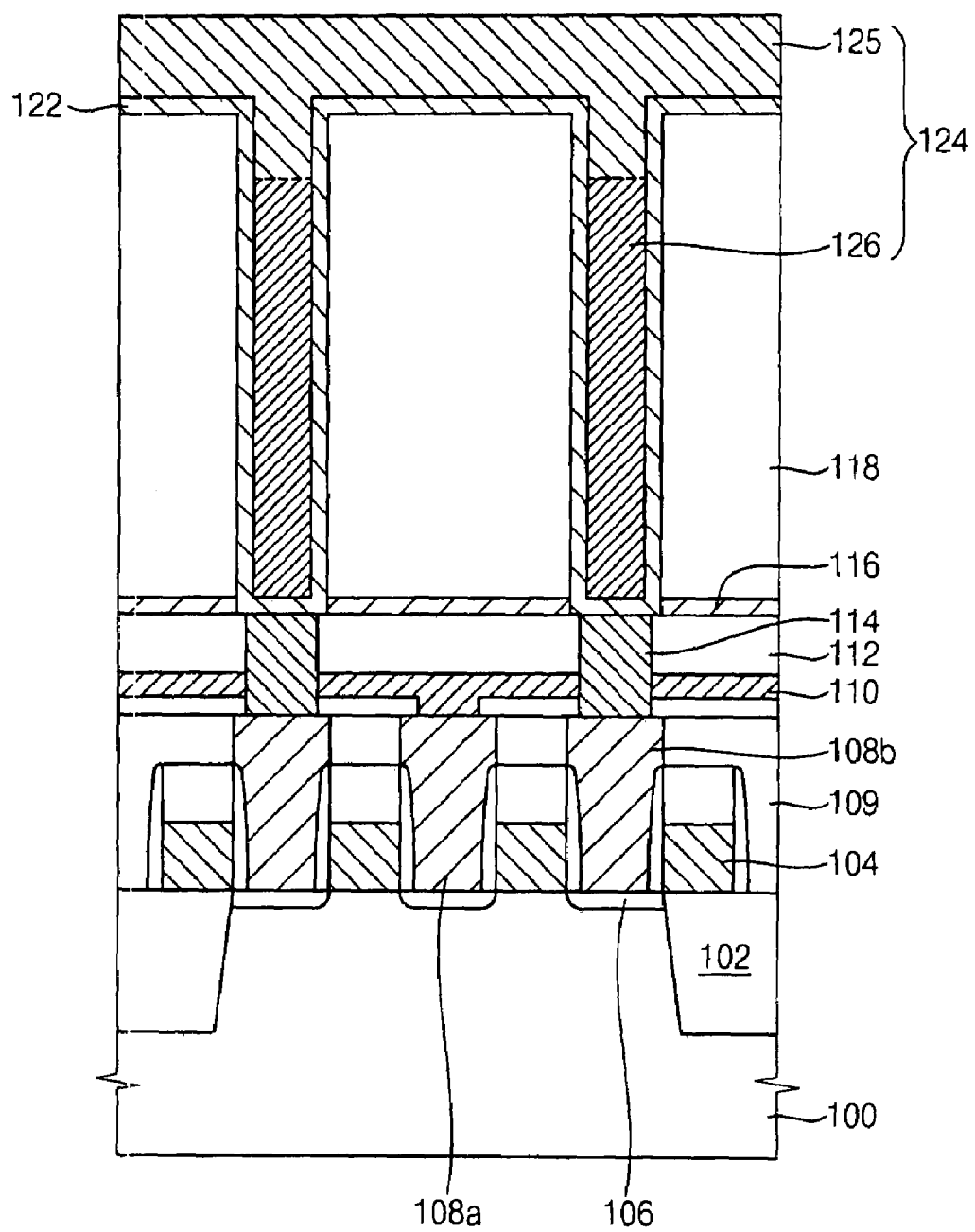

Referring to FIG. 7, a main thermal treatment may be performed on the preliminary insulating layer 124a to form an insulating layer 124, which may include an upper insulating film 125 and a lower insulating film 126. The main thermal treatment may be performed to remove byproducts and moisture from the preliminary upper insulating film 125a. Thus, the upper insulating film 125 may be denser than the preliminary upper insulating film 125a. In addition, byproducts and moisture diffused into the preliminary lower insulating film 126a by the preliminary thermal treatment may be removed by the main thermal treatment so that the lower insulating film 126 may be denser than the preliminary lower insulating film 126a. The preliminary thermal treatment may be performed using an inactive gas (e.g., nitrogen ($N_2$) gas). Alternatively, the preliminary thermal treatment may be performed using an inert gas (e.g., argon (Ar) gas).

When the main thermal treatment is performed at a temperature lower than about 370° C., the byproducts and moisture may not be sufficiently removed from the preliminary upper insulating film 125a. When the main thermal treatment is performed at a temperature higher than about 440° C., the conductive layer 122 may become thermally damaged. Thus, the main thermal treatment may be performed at a temperature in the range of about 370° C. to about 440° C. When the main thermal treatment is performed for less than about 27 minutes, the byproducts and moisture may not be sufficiently removed from the preliminary upper insulating film 125a. When the main thermal treatment is performed for more than about 33 minutes, the conductive layer 122 may become thermally damaged. Thus, the main thermal treatment may be performed for a duration of about 27 to about 33 minutes.

Figure 8:
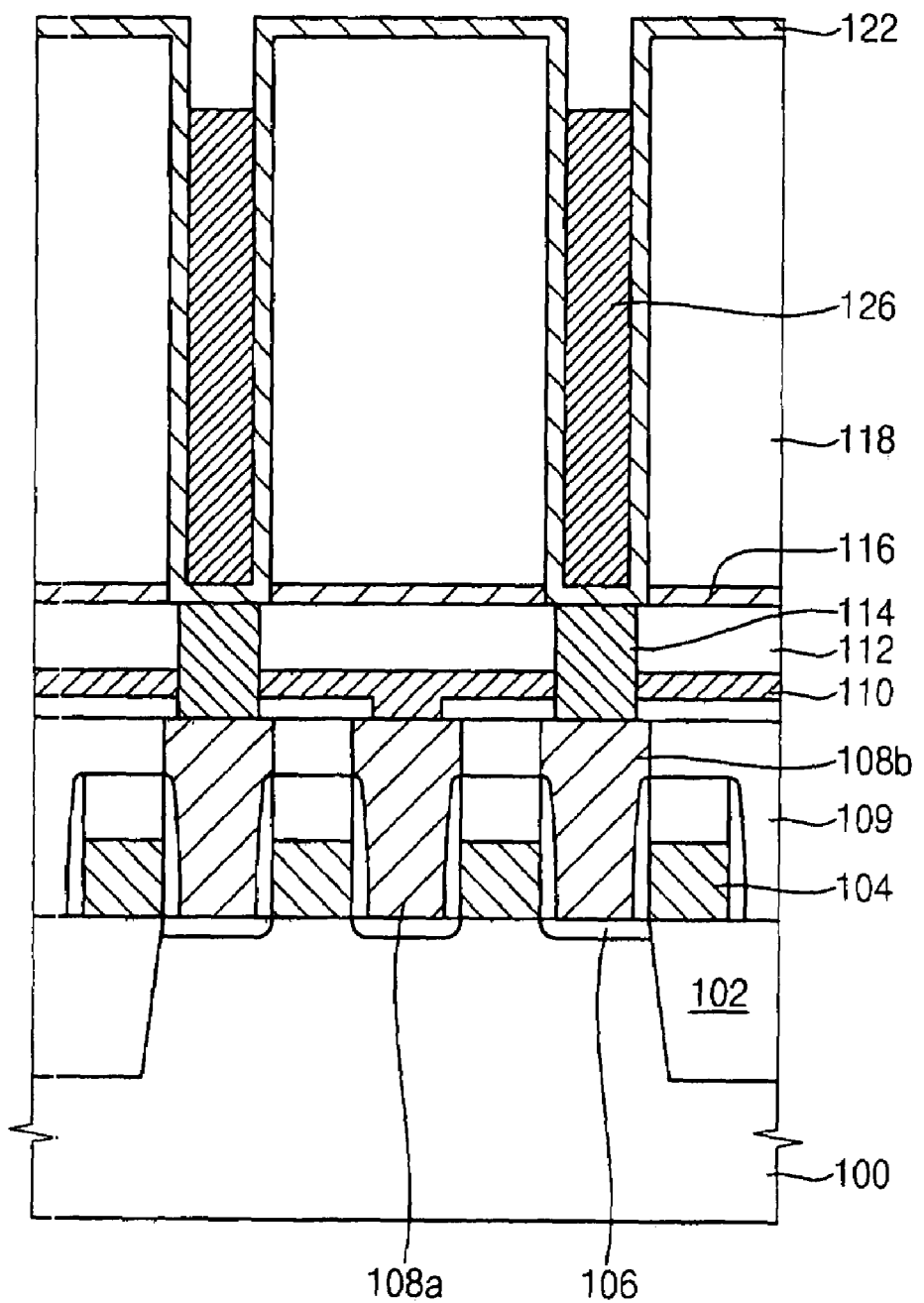

Referring to FIG. 8, the upper insulating film 125 may be selectively removed. A top portion of the conductive layer 122 may be exposed as a result of selectively removing the upper insulating film 125. As described above, the upper insulating film 125 may include silicon oxide. Thus, the upper insulating film 125 may be removed using ca solution including ammonium hydroxide ($NH_4OH$), tetraethylammonium hydroxide (TMAH), or a combination thereof. As described above, the lower insulating film 126 and the upper insulating film 125 may have different properties (e.g., etch properties). Thus, the lower insulating layer 126 may remain while the upper insulating layer 125 may be removed.

Figure 9:
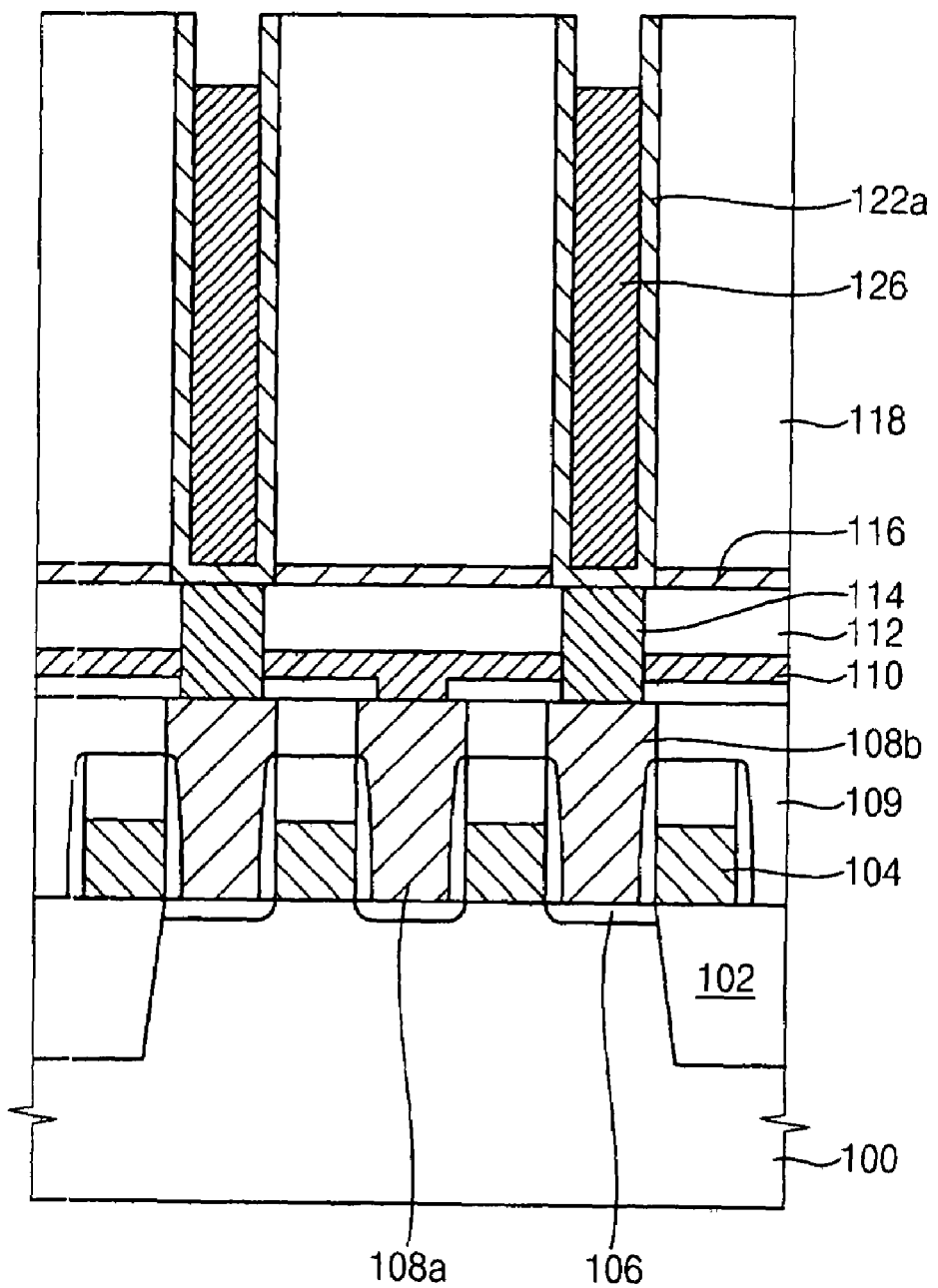

Referring to FIG. 9, the top portion of the conductive layer 122 may be removed by an etch-back process. The top portion of the conductive layer 122 located on the upper face of the mold layer 118 may be removed by the etch-back process so that the conductive layer 122 may be transformed into the lower electrode 122a located on the inner face (e.g., sidewall) of the opening 120. The lower electrode 122a may have a cylindrical shape. The etch-back process may be a dry etch process. After the above processes are performed, the lower insulating film 126 may still remain inside the lower electrode 122a. In addition, the mold layer 118 may surround an outer portion of the lower electrode 122a.

Figure 10:
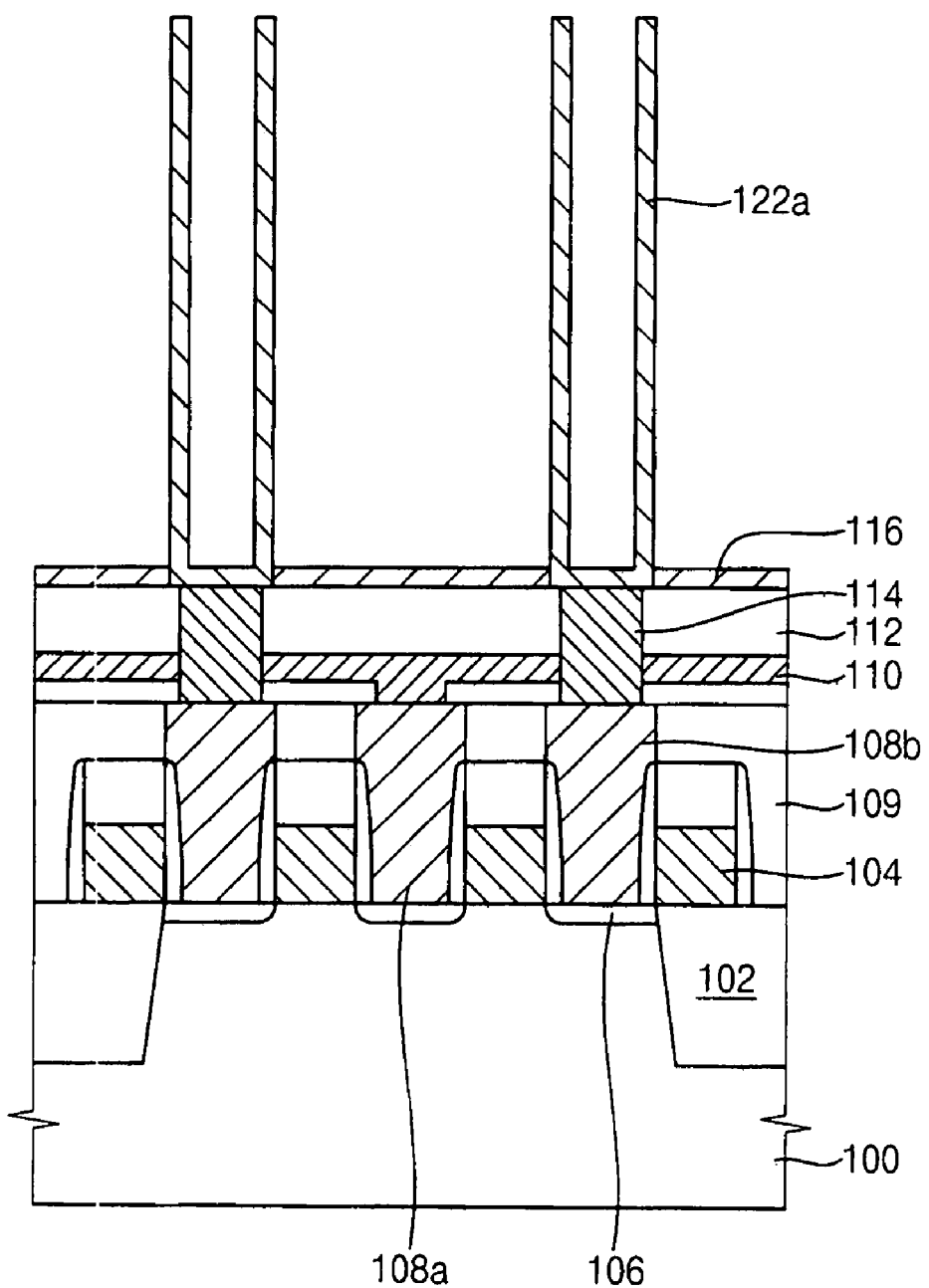

Referring to FIG. 10, the lower insulating film 126 and the mold layer 118 may be removed by a wet: etching process. For example, the lower insulating film 126 and the mold layer 118 may be removed using an etching solution including hydrogen fluoride (HF). Alternatively, the etching solution may include ammonium hydroxide, hydrogen peroxide, and deionized water. The etching solution may also be a limulus amebocyte lysate (LAL) etching solution including ammonium fluoride, hydrogen fluoride, and pure water.

The outer wall, upper face, inner wall, and bottom face of the lower electrode 122a may be exposed by removing the lower insulating film 126 and the mold layer 118. A capacitor including the lower electrode 122a may have a capacitance higher than that of a conventional capacitor having a concave-shaped lower electrode, because the increased exposed area of the lower electrode 122a corresponds to an increased effective area of the capacitor.

Referring to FIG. 11, a dielectric layer 127 may be formed on the etch stop layer 116 and on the outer sidewall, the upper face, the inner sidewall, and the bottom face of the lower electrode 122a. The dielectric layer 127 may be formed by depositing a metal oxide having a relatively high dielectric constant. For example, the metal oxide may include aluminum oxide and hafnium oxide.

An upper electrode 128 may be formed on the dielectric layer 127. The upper electrode 128 may be formed of a metal or a material including a metal. For example, a metal or a material including a metal may be deposited on the dielectric layer 127, and polysilicon may be deposited to form the upper electrode 128. As a result, a dynamic random access memory device may be manufactured.

According to example embodiments, a chemical mechanical polishing (CMP) process may not be performed during a node separation for forming a lower electrode of a capacitor. Thus, the time and cost for the node separation may be reduced. In addition, an upper portion of an insulating layer covering a conductive layer (which may be transformed into the lower electrode) may be chemically removed to expose a top portion of the conductive layer. Thus, damage to the conductive layer may be reduced. Consequently, defects to a semiconductor device may decrease and reliability may increase.

While example embodiments have been disclosed herein, it should be understood that other variations may be possible. Such variations are not to be regarded as a departure from the spirit and scope of example embodiments of the present disclosure, and all such modifications as would be obvious to one skilled in the art are intended to be included within the scope of the following claims.

What is claimed is:

1. A method of manufacturing a capacitor, comprising:
   forming a mold layer having an opening exposing a contact plug on a substrate;
   forming a conductive layer on a sidewall of the opening and on an upper face of the mold layer;
   forming a spin-on layer on the conductive layer so as to fill the opening;
   providing ozone gas onto the spin-on layer so as to transform the spin-on layer into an insulating layer, the insulating layer including an upper insulating film having a lower face that is lower than the upper face of the mold layer and a lower insulating film below the upper insulating film;
   removing the upper insulating film to expose a top portion of the conductive layer;
   forming a cylindrical lower electrode by removing the exposed top portion of the conductive layer;
   removing the mold layer and the lower insulating film;
   forming a dielectric layer on the substrate and on an outer sidewall, an inner sidewall, and a bottom face of the cylindrical lower electrode; and
   forming an upper electrode on the dielectric layer.

2. The method of claim 1, wherein forming the spin-on layer includes:
   forming a preliminary spin-on layer on the conductive layer, the preliminary spin-on-layer having a dielectric material and a solvent; and
   performing a preliminary thermal treatment on the preliminary spin-on layer to form the spin-on layer.

3. The method of claim 2, wherein performing the preliminary thermal treatment includes:
   performing a preliminary first thermal treatment at a temperature of about 70° C. to about 90° C. for about 1 minute to about 3 minutes in a nitrogen atmosphere;
   performing a preliminary second thermal treatment at a temperature of about 90° C. to about 260° C. for about 1 minute to about 3 minutes in a nitrogen atmosphere; and
   performing a preliminary third thermal treatment at a temperature of about 260° C. to about 370° C. for about 1 minute to about 3 minutes in a nitrogen atmosphere.

4. The method of claim 1, wherein forming the insulating layer includes:
   providing the upper portion of the spin-on layer with the ozone gas to transform the spin-on layer into a preliminary insulating layer, the preliminary insulating layer having a preliminary upper insulating film and a preliminary lower insulating film; and
   performing a main thermal treatment to transform the preliminary insulating layer into the insulating layer.

5. The method of claim 4, wherein an ozone density of the ozone gas is about 100 g/Nm$^3$ to about 350 g/Nm$^3$, the preliminary insulating layer is formed at a temperature of about 50° C. to about 450° C., and the main thermal treatment is performed at a temperature of about 370° C. to about 440° C.

6. The method of claim 1, wherein removing the upper insulating film is performed using a solution including at least one of ammonium hydroxide and tetramethylammonium hydroxide.

7. The method of claim 1, wherein forming the cylindrical lower electrode is performed by an etch-back process.

8. The method of claim 1, wherein removing the mold layer and the lower insulating film is performed by a wet etching process using an etching solution including hydrogen fluoride.

9. The method of claim 1, wherein removing the mold layer and the lower insulating film is performed by a wet etching process using an etching solution including ammonium hydroxide, hydrogen peroxide, and deionized water.

10. The method of claim 1, wherein removing the mold layer and the lower insulating film is performed by an wet etching process using a limulus amebocyte lysate etching solution including ammonium fluoride, hydrogen fluoride, and pure water.

11. A method of manufacturing a dynamic random access memory device, comprising:
   forming a transistor on a substrate;

forming a first insulating interlayer having first and second contact pads connected to a source/drain region of the transistor;

forming a second insulating interlayer having a bit line connected to the first contact pad;

forming a third insulating interlayer having a contact plug connected to the second contact pad; and forming, on the transistor, a capacitor according to the method of claim 1.

12. The method of claim 11, wherein forming the spin-on layer includes:

forming a preliminary spin-on layer on the conductive layer, the preliminary spin-on layer having a dielectric material and a solvent; and performing a preliminary thermal treatment on the preliminary spin-on layer to form the spin-on layer.

13. The method of claim 12, wherein performing the preliminary thermal treatment includes:

performing a preliminary first thermal treatment at a temperature of about 70° C. to about 90° C. for about 1 minute to about 3 minutes in a nitrogen atmosphere;

performing a preliminary second thermal treatment at a temperature of about 90° C. to about 260° C. for about 1 minute to about 3 minutes in a nitrogen atmosphere; and performing a preliminary third thermal treatment at a temperature of about 260° C. to about 370° C. for about 1 minute to about 3 minutes in a nitrogen atmosphere.

14. The method of claim 11, wherein forming the insulating layer includes:

providing the upper portion of the spin-on layer with the ozone gas to transform the spin-on layer into a preliminary insulating layer, the preliminary insulating layer having a preliminary upper insulating film and a preliminary lower insulating film; and performing a main thermal treatment to transform the preliminary insulating layer into the insulating layer.

15. The method of claim 14, wherein an ozone density of the ozone gas is about 100 g/Nm$^3$ to about 350 g/Nm$^3$, the preliminary insulating layer is formed at a temperature of about 50° C. to about 450° C., and the main thermal treatment is performed at a temperature of about 370° C. to about 440° C.

16. The method of claim 11, wherein removing the upper insulating film is performed using a solution including at least one of ammonium hydroxide and tetramethylammonium hydroxide.

17. The method of claim 11, wherein forming the cylindrical lower electrode is performed by an etch-back process.

18. The method of claim 11, wherein removing the mold layer and the lower insulating film is performed by a wet etching process using an etching solution including hydrogen fluoride.

19. The method of claim 11, wherein removing the mold layer and the lower insulating film is performed by an wet etching process using an etching solution including ammonium hydroxide, hydrogen peroxide, and deionized water.

20. The method of claim 11, wherein removing the mold layer and the lower insulating film is performed by an wet etching process using a limulus amebocyte lysate etching solution including ammonium fluoride, hydrogen fluoride, and pure water.

* * * * *